(12) United States Patent
Ohta et al.

(10) Patent No.: US 6,903,512 B2
(45) Date of Patent: Jun. 7, 2005

(54) HALF MIRROR FILM PRODUCING METHOD AND OPTICAL ELEMENT COMPRISING A HALF MIRROR FILM

(75) Inventors: Tatsuo Ohta, Tokyo (JP); Satoshi Nakano, Tokyo (JP); Yumi Muramatsu, Tokyo (JP)

(73) Assignee: Konica Corporation, Tokyo (JP)

( * ) Notice: Subject to any disclaimer, the term of this patent is extended or adjusted under 35 U.S.C. 154(b) by 247 days.

(21) Appl. No.: 10/207,458

(22) Filed: Jul. 29, 2002

(65) Prior Publication Data

US 2003/0146709 A1 Aug. 7, 2003

(30) Foreign Application Priority Data

Aug. 7, 2001 (JP) ..................................... 2001-239011

(51) Int. Cl.$^7$ ............................................... G09G 3/10
(52) U.S. Cl. ............................. 315/169.1; 315/169.3; 359/71
(58) Field of Search .......................... 315/169.1, 169.3, 315/169.4, 169.2; 359/71, 72, 629, 640; 430/495, 270; 313/491, 493; 438/400, 401, 404, 513

(56) References Cited

U.S. PATENT DOCUMENTS

| | | | |
|---|---|---|---|
| 4,891,305 A | * 1/1990 | Oba et al. | 430/495 |
| 5,219,707 A | * 6/1993 | Namba | 430/270 |
| 5,272,554 A | 12/1993 | Ji et al. | 359/67 |
| 5,343,115 A | * 8/1994 | Anandan et al. | 315/169.4 |
| 5,537,666 A | * 7/1996 | Mori et al. | 372/46 |
| 5,587,335 A | * 12/1996 | Mori et al. | 437/129 |
| 5,621,832 A | 4/1997 | Yokoyama et al. | 385/48 |
| 5,682,402 A | 10/1997 | Nakayama et al. | 372/99 |
| 6,219,188 B1 | 4/2001 | Tsukamoto | 359/629 |
| 6,479,942 B2 | * 11/2002 | Kimura | 315/169.3 |

FOREIGN PATENT DOCUMENTS

| | | |
|---|---|---|
| EP | 1 342 810 A1 | 9/2003 |
| WO | WO 02/48428 A1 | 6/2002 |

OTHER PUBLICATIONS

Patent Abstracts of Japan, vol. 200, No. 14, Mar. 5, 2001 of JP 2000 309871 A (Sekisui Chem. Co. Ltd.) Nov. 7, 2000.
Gherardi et al., "A new approach to $SiO_2$ deposit using a $N_2$–$SiH_4$–$N_2O$ glow dielectric barrier–controlled discharge at atmospheric pressure", Journal of Physics D (Applied Physics), Oct. 7, 2000, IOP Publishing Ltd., UK, vol. 33, No. 19, pp. L104–L108, XP002261784; ISN: 0022-3727.
Patent Abstracts of Japan, vol. 008, No. 257 (P–316) Nov. 24, 1984 of JP 59 127001 A (Toyota Motor Corp.), Jul. 21, 1984.

* cited by examiner

*Primary Examiner*—Don Wong
*Assistant Examiner*—Jimmy Vu
(74) *Attorney, Agent, or Firm*—Frishauf, Holtz, Goodman & Chick, P.C.

(57) ABSTRACT

A method of producing a half mirror film on a substrate having a light transmissive property, comprising steps of: electrically discharging between electrodes facing each other under an atmospheric pressure or an approximate atmospheric pressure so as to make an reactive gas on a plasma state; and exposing a substrate to the reactive gas on the plasma state so as to form a half mirror film on the substrate.

20 Claims, 9 Drawing Sheets

HALF MIRROR FILM PRODUCING METHOD AND OPTICAL ELEMENT COMPRISING A HALF MIRROR FILM

BACKGROUND OF THE INVENTION

The present invention relates to a half mirror film forming method in which a half mirror film is formed on a substrate, and to an optical member provided with a half mirror film.

Heretofore, such as an optical substrate or an optical film and an optical lens have been known as parts having a half mirror film on a substrate having a light transmissive property. For example, an optical substrate and an optical film have been utilized in electro-optical equipment such as a semi transmissive type liquid crystal display device, a spatial optical modulation device, and an optical lens in various applications such as an optical element for laser.

As a method to prepare a half mirror film having light transmissive property, is known a coating method in which materials to form a half mirror film being dissolved in suitable solvents are provided by dipping or coating, or a vacuum evaporation method.

However, in a coating method, uniformity of film thickness or optical functions is not necessarily sufficient and durability level is neither satisfactory. Further, in a vacuum evaporation method, the productivity is low since the number of sheets of an optical substrate or an optical film loaded in a evaporation chamber at once is extremely small, in addition, there is also a problem of poor adhesion with a half mirror film in case of a resin substrate because a heating vacuum evaporation method cannot be applied, which may cause a half mirror film being easily cracked.

SUMMARY OF THE INVENTION

In view of the problems in conventional techniques described above, the object of the invention is to provide a forming method of a half mirror film having property of high productivity, superior adhesion with a light transmissive substrate as well as hardly being cracked, and an optical member (optical member, optical element) having the half mirror film.

The aforementioned object has been achieved by the following constitution of the invention. That is, a forming method of a half mirror film according to the invention is one in which a half mirror film is formed on a light transmissive substrate, characterized by that said half mirror film is formed by making a reactive gas a plasma state by means of discharge between electrodes facing each other and the aforementioned substrate being exposed to said reactive gas in a plasma state.

The aforementioned half mirror is preferably a dielectric mirror which is suitably applied to, for example, a partially transmissive type liquid crystal display device, since the light absorption is small to cause no light loss of a back light source.

Further, the aforementioned dielectric mirror is preferably composed of laminated plural layers of a layer comprising silicon oxide as a main component and a layer comprising titanium oxide as a main component, which allow to prepare a dielectric mirror having an aimed transmittance and reflectance by designing refractive index and layer thickness of each layer.

Further, the aforementioned dielectric mirror is preferably composed of laminating at least a layer comprising silicon oxide as a main component and a layer comprising titanium oxide, tantalum oxide, zirconium oxide, silicon nitride, indium oxide or aluminum oxide as a main component, which allow to prepare a dielectric mirror having an aimed percent transmission and reflectance by designing a refractive index and a layer thickness of each layer.

Further, the aforementioned dielectric mirror is preferably composed of laminating at least a layer comprising silicon oxide as a main component and a layer comprising titanium oxide, tantalum oxide, zirconium oxide, silicon nitride or indium oxide and a layer comprising aluminum oxide as a main component, which allow to prepare a dielectric mirror having an aimed transmittance and reflectance by designing refractive index and layer thickness of each layer.

Further, the aforementioned light transmissive substrate is preferably made of resin or glass which allow to prepare a half mirror film having high productivity, superior optical functions and enhanced adhesion with a thin film.

Further, a half mirror film having minuteness, high uniformity of layer thickness, superior optical functions and enhanced adhesion with a substrate can be prepared by generating the aforementioned discharge at a high frequency voltage of over 100 kHz and an electric power supply of not less than 1 W/cm$^2$.

Further, a half mirror film having high productivity, minuteness, high uniformity of layer thickness, superior optical functions and enhanced adhesion with a substrate can be prepared by the aforementioned high frequency voltage being a continuous sign wave.

Further, a half mirror film having high productivity, minuteness, high uniformity of layer thickness, superior optical functions and enhanced adhesion with a substrate can be prepared by forming a half mirror film on the long roll film by means of the aforementioned resin substrate being a long roll film, being transported between the electrodes and the reactive gas being introduced between the electrodes.

Further, a half mirror film having high productivity, minuteness, high uniformity of layer thickness, superior optical functions and enhanced adhesion with a substrate can be prepared by spraying the reactive gas in a plasma state onto the lens, herein the resin substrate being a lens.

Further, a half mirror film having high productivity, minuteness, high uniformity of layer thickness, superior optical functions and enhanced adhesion with a substrate can be prepared by introducing the reactive gas containing a reactive gas between the electrodes, herein, the mixed gas being containing from 99.9 to 90 volume % of an inert gas.

Further, the reaction is accelerated by the mixed gas being containing from 0.01 to 5 volume % of a component selected from oxygen, ozone, hydrogen peroxide, carbon dioxide, carbon monoxide, hydrogen and nitrogen, and a half mirror film having minuteness and superior quality can be prepared.

Further, an uniform thin film can be prepared on a substrate by the reactive gas being containing a component selected from organometalic compounds and organic compounds.

Further, free of corrosive or poisonous gases and reduced contamination of processes can be achieved by the organometalic compound being selected from metal alkoxides, alkylated metals and metal complexes.

Further, superior adhesion with an under layer and prevention of film cracking can be achieved by the carbon content in the half mirror film being from 0.2 to 5 weight % since a film treated in the plasma state is provided with flexibility.

Further, superior adhesion with an under layer and prevention of film cracking can be achieved by the carbon content in the half mirror film being from 0.3 to 3 weight % since the film treated in the plasma state is provided with flexibility.

Optical members having superior optical functions and enhanced adhesion between a substrate and a thin film can be obtained by being provided with a half mirror film formed by the preparation method of a half mirror film by means of a treatment in a plasma state.

An optical member having optical functions of an aimed transmittance and reflectance as well as enhanced adhesion of a thin layer and a substrate can be prepared by forming the half mirror film with lamination of a layer having a low refractive index of which a main component is silicon oxide and a layer having a high refractive index of which main component is titanium oxide, on a glass substrate, as described in Table 1 or Table 2. Herein, the substrate may be a resin substrate.

TABLE 1

| Layer No. | | Refractive index | Optical film thickness |
|---|---|---|---|
| 1 | A layer of high refractive index | 2.15 to 2.43 | 0.072 to 0.079 |
| 2 | A layer of low refractive index | 1.35 to 1.51 | 0.128 to 0.139 |
| 3 | A layer of high refractive index | 2.15 to 2.43 | 0.299 to 0.324 |
| 4 | A layer of low refractive index | 1.35 to 1.51 | 0.110 to 0.120 |
| 5 | A layer of high refractive index | 2.15 to 2.43 | 0.205 to 0.222 |
| 6 | A layer of low refractive index | 1.35 to 1.51 | 0.149 to 0.162 |
| 7 | A layer of high refractive index | 2.15 to 2.43 | 0.320 to 0.347 |
| 8 | A layer of low refractive index | 1.35 to 1.51 | 0.270 to 0.293 |
| 9 | A layer of high refractive index | 2.15 to 2.43 | 0.276 to 0.299 |
| 10 | A layer of low refractive index | 1.35 to 1.51 | 0.340 to 0.370 |
| 11 | A layer of high refractive index | 2.15 to 2.43 | 0.313 to 0.339 |
| 12 | A layer of low refractive index | 1.35 to 1.51 | 0.048 to 0.052 |
| 13 | A layer of high refractive index | 2.15 to 2.43 | 0.047 to 0.05 |
| Substrate | Glass | 1.46 to 1.58 | |

TABLE 2

| Layer No. | | Refractive index | Optical film thickness |
|---|---|---|---|
| 1 | A layer of high refractive index | 2.15 to 2.43 | 0.371 to 0.400 |
| 2 | A layer of low refractive index | 1.35 to 1.51 | 0.318 to 0.345 |
| 3 | A layer of high refractive index | 2.15 to 2.43 | 0.323 to 0.350 |
| 4 | A layer of low refractive index | 1.35 to 1.51 | 0.284 to 0.308 |
| 5 | A layer of high refractive index | 2.15 to 2.43 | 0.287 to 0.311 |
| 6 | A layer of low refractive index | 1.35 to 1.51 | 0.306 to 0.331 |
| 7 | A layer of high refractive index | 2.15 to 2.43 | 0.251 to 0.272 |
| 8 | A layer of low refractive index | 1.35 to 1.51 | 0.229 to 0.248 |
| 9 | A layer of high refractive index | 2.15 to 2.43 | 0.148 to 0.161 |
| 10 | A layer of low refractive index | 1.35 to 1.51 | 0.205 to 0.222 |
| 11 | A layer of high refractive index | 2.15 to 2.43 | 0.232 to 0.252 |
| 12 | A layer of low refractive index | 1.35 to 1.51 | 0.240 to 0.260 |
| 13 | A layer of high refractive index | 2.15 to 2.43 | 0.062 to 0.068 |
| 14 | A layer of low refractive index | 1.35 to 1.51 | 0.263 to 0.288 |
| Substrate | Glass | 1.46 to 1.58 | |

Further, an optical member having an aimed transmittance and reflectance as well as enhanced adhesion of a thin layer and a substrate can be prepared by forming the half mirror film with lamination of a layer having a low refractive index of which a main component is silicon oxide and a layer having a high refractive index of which main component is titanium oxide as described in Table 3 or Table 4. Herein, the substrate may be a resin substrate.

TABLE 3

| Layer No. | | Refractive index | Optical film thickness |
|---|---|---|---|
| 1 | A layer of high refractive index | 2.15 to 2.43 | 0.250 to 0.451 |
| 2 | A layer of low refractive index | 1.35 to 1.51 | 0.120 to 0.320 |
| 3 | A layer of high refractive index | 2.15 to 2.43 | 0.140 to 0.360 |
| 4 | A layer of low refractive index | 1.35 to 1.51 | 0.065 to 0.100 |
| 5 | A layer of high refractive index | 2.15 to 2.43 | 0.085 to 0.115 |
| Substrate | Glass | 1.46 to 1.58 | |

TABLE 4

| Layer No. | | Refractive index | Optical film thickness |
|---|---|---|---|
| 1 | A layer of high refractive index | 2.15 to 2.43 | 0.281 to 0.305 |
| 2 | A layer of low refractive index | 1.35 to 1.51 | 0.251 to 0.279 |
| 3 | A layer of high refractive index | 2.15 to 2.43 | 0.261 to 0.285 |
| 4 | A layer of low refractive index | 1.35 to 1.51 | 0.201 to 0.225 |
| 5 | A layer of high refractive index | 2.15 to 2.43 | 0.551 to 0.573 |
| 6 | A layer of low refractive index | 1.35 to 1.51 | 0.601 to 0.625 |
| 7 | A layer of high refractive index | 2.15 to 2.43 | 0.481 to 0.501 |
| 8 | A layer of low refractive index | 1.35 to 1.51 | 0.410 to 0.448 |
| 9 | A layer of high refractive index | 2.15 to 2.43 | 0.258 to 0.281 |
| 10 | A layer of low refractive index | 1.35 to 1.51 | 0.261 to 0.290 |
| Substrate | Glass | 1.46 to 1.58 | |

Further, an optical member having an aimed transmittance and reflectance as well as enhanced adhesion of a thin layer and a substrate can be prepared by forming the half mirror film with lamination of a layer having a low refractive index of which a main component is silicon oxide, a layer having a medium refractive index of which a main component is aluminum oxide, and a layer having a high refractive index of which main component is tantalum oxide as described in Table 5. Herein, the substrate may be a resin substrate.

TABLE 5

| Layer No. | | Refractive index | Optical film thickness |
|---|---|---|---|
| 1 | A layer of medium refractive index | 1.61 to 1.82 | 0.176 to 0.193 |
| 2 | A layer of high refractive index | 1.91 to 2.15 | 0.367 to 0.392 |
| 3 | A layer of low refractive index | 1.35 to 1.51 | 0.215 to 0.243 |
| 4 | A layer of high refractive index | 1.91 to 2.15 | 0.195 to 0.231 |
| Substrate | Acryl resin | 1.50 to 1.505 | |

Further, an optical member having optical functions of an aimed transmittance and reflectance as well as enhanced adhesion of a thin layer and a substrate can be prepared by forming the half mirror film with lamination of a layer having a low refractive index of which a main component is silicon oxide and a layer having a high refractive index of which main component is titanium oxide as described in Table 6. Herein, the substrate may be a resin substrate.

TABLE 6

| Layer No. | | Refractive index | Optical film thickness |
|---|---|---|---|
| 1 | A layer of low refractive index | 1.35 to 1.51 | 0.281 to 0.311 |
| 2 | A layer of high refractive index | 1.91 to 2.15 | 0.261 to 0.231 |
| 3 | A layer of low refractive index | 1.35 to 1.51 | 0.39 to 0.421 |
| Substrate | Glass | 1.46 to 1.58 | |

In Tables 1 to 6, each of the layer No. 13, the layer No. 14, the layer No. 5, the layer No. 10, the layer No. 4 and the layer No. 3 is firstly formed on a glass substrate as an undermost layer, and the layer No. 1 as an uppermost layer. Further, above each refractive index is a refractive index for the light having a wavelength of 510 nm, and the optical film thickness is a value expressed by (n×d/510), wherein n is the said refractive index and d is an actual film thickness (unit: nm, a geometrical film thickness). Further, with respect to layer compositions shown in Tables 1 to 6, other layers may be provided between each layer provided that they do not influence the reflectance or transmittance much, and these compositions are included in the invention.

Further, in optical members in which a half mirror film is provided on a light transmissive substrate, an optical member having a film, which is being flexible, superior in adhesion with a substrate or an under layer and has few cracks, can be prepared by adjusting the carbon content of the half mirror film at from 0.2 to 5 weight %.

Further, in optical members in which a half mirror film is provided on a light transmissive substrate, an optical member having a film, which is flexible, superior in adhesion with a substrate or an under layer and has few cracks, can be prepared by adjusting the carbon content of the half mirror film at from 0.3 to 3 weight %.

Further, in optical members in which a half mirror film is provided on a light transmissive substrate, an optical member, having small light absorption and free of light loss of a back light source, which is suitably utilized, for example, in a liquid crystal display device can be prepared by using a dielectric mirror as the half mirror.

Further, in optical members in which a half mirror film is provided on a light transmissive substrate, the half mirror film can be utilized as an optical member having an aimed reflectance and transmittance by the dielectric mirror being composed of laminated plural layers of a layer containing silicon oxide as a main component and a layer containing titanium oxide as a main component.

Further, the half mirror film can be utilized as an optical member having an aimed reflectance and transmittance by the dielectric mirror being composed of at least laminated layers of a layer comprising silicon oxide as a main component and a layer comprising titanium oxide, tantalum oxide, zirconium oxide, silicon nitride or indium oxide as a main component.

Further, the half mirror film can be utilized as an optical member having an aimed reflectance and transmittance by the dielectric mirror being composed of at least laminated layers of a layer comprising silicon oxide as a main component, a layer comprising titanium oxide, tantalum oxide, zirconium oxide, silicon nitride or indium oxide as a main component and a layer comprising aluminum oxide as a main component.

In optical members in which a half mirror film is provided on a light transmissive substrate, an optical member having a high productivity, minuteness and uniformity of film thickness, superior optical functions and superior adhesion with a thin film can be prepared by the light transmissive substrate being a resin substrate or a glass substrate.

Optical members according to the invention can be utilized as an optical member provided with a half mirror film which has an uniform film thickness on a substrate by forming and superior optical functions, by adjusting a refractive index of the layer having the largest refractive index among each layer at not less than 2.2.

Optical members according to the invention can be utilized as an optical member provided with a half mirror film which has high productivity, minuteness and high uniformity of film thickness, superior optical functions and enhanced adhesion with a thin film by the resin substrate being a resin film, since it is easily loaded between the electrodes when being treated in the plasma state.

Optical members according to the invention can be utilized as an optical member having a half mirror film provided with high productivity, minuteness and high uniformity of film thickness, superior optical functions and enhanced adhesion with a thin film by the resin substrate being a lens and being sprayed with the generated plasma at the treatment in a plasma state

DETAILED DESCRIPTION OF THE PREFERRED EMBODIMENTS EMBODIMENT OF THE INVENTION

Figure 1:
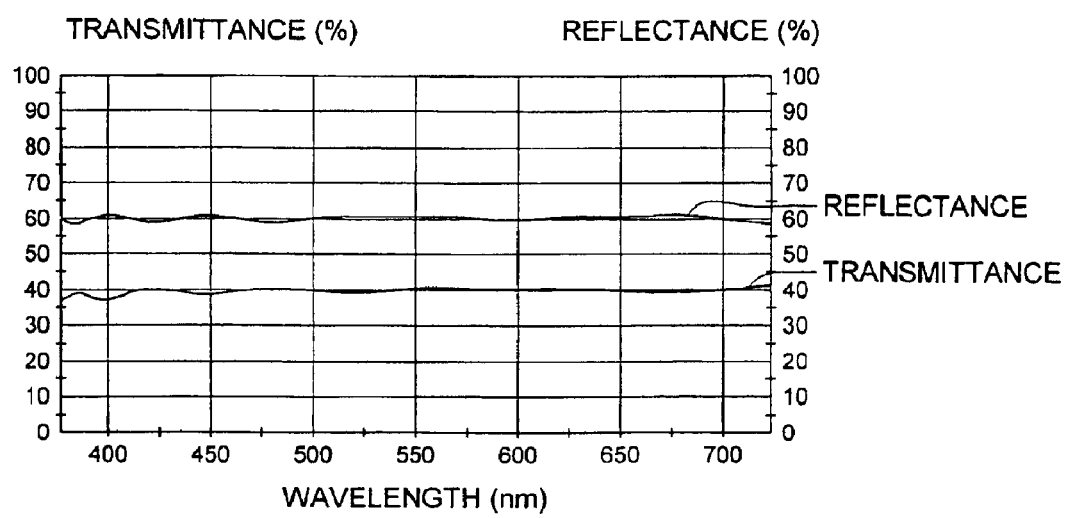
FIG. 1 is a graph showing the transmittance and reflectance of a half mirror film according to the design of Table 7 in an embodiment of the invention.

Embodiments according to the invention will be explained below.

A half mirror film is considered to be briefly divided into two kinds. One is an partially transmissive alloy mirror film in which a metal thin film comprising such as Au, Ag, Cu, Pt, Ni, Pd, Se, Te, Rh, Ir, Ge, Os, Ru, Cr and W or another metal thin film or a dielectric film is laminated (including lamination of not less than two layers) thereon. The other is a dielectric film or a dielectric mirror film in which dielectric films or dielectric films of different refractive indexes are laminated (including lamination of not less than two layers).

A partially transmissive alloy mirror film has large light absorption, for example, such as a transmittance of 40%, a reflectance of 50% and an absorption of 10%, and is not necessarily suitable for the application in a liquid crystal display device of a partially transmissive type because of large light loss of a back light source. On the other hand, a dielectric mirror film is preferably applicable to various applications since it has no such light loss.

Further, with respect to the function as a half mirror film, the reflectance and transmittance can be freely designed by selecting the composing materials and the film thickness. Specifically, a dielectric mirror film is prepared by laminating layers of different refractive indexes, and can be provided with desired functions by laminating several to several tens of layers having a high refractive index and a low refractive index in turn and by designing such as a refractive index and a layer thickness of each layer.

As a high refractive index layer of a dielectric mirror film, are preferably used ones including titanium oxide or tantalum oxide as a main component and having a refractive index n of $1.85 \leq n \leq 2.60$, and may be included nitrogen, carbon, tin, nickel or niobium as a side component. Further, as a low refractive index layer, are preferably used ones including silicon oxide or magnesium fluoride as a main component and having a refractive index n of $1.30 \leq n \leq 1.57$, and may be included nitrogen, carbon, fluorine, boron and tin as a side component.

Among the components, films in which plural layers of a low refractive index comprising silicon oxide ($SiO_2$) as a main component and a high refractive index comprising titanium oxide ($TiO_2$) as a main component can be preferably utilized. For example, a stack mirror in which $TiO_2$ (refractive index, n=2.35) and $SiO_2$ (refractive index, n=1.46) are laminated alternately can be utilized.

For example, in a partially transmissive type liquid crystal display device, when an optical member having a dielectric half mirror film between a back light and a liquid crystal, the design of a dielectric half mirror includes the following specifications as examples, however the invention is not limited thereby.

1. A design example in case of a ratio of transmittance to reflectance being 40/60 is shown in table 7. This is composed of a total of 13 layers including a low refractive index layer and a high refractive index layer being laminated on a glass substrate in the order of layer Nos. from 13 to 1.

TABLE 7

| Layer No. | Material | Refractive index | Extinction coefficient | Optical film thickness |
|---|---|---|---|---|
| 1 | $TiO_2$ | 2.34867 | 0.00037 | 0.07648704 |
| 2 | $SiO_2$ | 1.46180 | 0.00000 | 0.13459754 |
| 3 | $TiO_2$ | 2.34867 | 0.00037 | 0.31283745 |
| 4 | $SiO_2$ | 1.46180 | 0.00000 | 0.11558490 |
| 5 | $TiO_2$ | 2.34867 | 0.00037 | 0.21469850 |
| 6 | $SiO_2$ | 1.46180 | 0.00000 | 0.15640022 |
| 7 | $TiO_2$ | 2.34867 | 0.00037 | 0.33493599 |
| 8 | $SiO_2$ | 1.46180 | 0.00000 | 0.28253394 |
| 9 | $TiO_2$ | 2.34867 | 0.00037 | 0.28877475 |
| 10 | $SiO_2$ | 1.46180 | 0.00000 | 0.35592376 |
| 11 | $TiO_2$ | 2.34867 | 0.00037 | 0.32675487 |
| 12 | $SiO_2$ | 1.46180 | 0.00000 | 0.05033993 |
| 13 | $TiO_2$ | 2.34867 | 0.00037 | 0.04911753 |
| Substrate | Glass | 1.52092 | 0.00000 | |

Actually measured transmittance and reflectance of the dielectric half mirror film which was formed on a glass substrate according to the design of Table 7 described above are shown by a graph in FIG. 1.

2. A design example in case of a ratio of transmittance to reflectance being 20/80 is shown in table 8. This was composed of a total of 14 layers including a low refractive index layer and a high refractive index layer being laminated on a glass substrate in the order of layer Nos. from 14 to 1.

TABLE 8

| Layer No. | Material | Refractive index | Extinction coefficient | Optical film thickness |
|---|---|---|---|---|
| 1 | $TiO_2$ | 2.34867 | 0.00037 | 0.38748435 |
| 2 | $SiO_2$ | 1.46180 | 0.00000 | 0.33217658 |
| 3 | $TiO_2$ | 2.34867 | 0.00037 | 0.33713691 |
| 4 | $SiO_2$ | 1.46180 | 0.00000 | 0.29640595 |
| 5 | $TiO_2$ | 2.34867 | 0.00037 | 0.29905633 |
| 6 | $SiO_2$ | 1.46180 | 0.00000 | 0.31910406 |
| 7 | $TiO_2$ | 2.34867 | 0.00037 | 0.26218421 |
| 8 | $SiO_2$ | 1.46180 | 0.00000 | 0.23897652 |

TABLE 8-continued

| Layer No. | Material | Refractive index | Extinction coefficient | Optical film thickness |
|---|---|---|---|---|
| 9 | TiO$_2$ | 2.34867 | 0.00037 | 0.15501907 |
| 10 | SiO$_2$ | 1.46180 | 0.00000 | 0.21418007 |
| 11 | TiO$_2$ | 2.34867 | 0.00037 | 0.24266694 |
| 12 | SiO$_2$ | 1.46180 | 0.00000 | 0.25078465 |
| 13 | TiO$_2$ | 2.34867 | 0.00037 | 0.06588711 |
| 14 | SiO$_2$ | 1.46180 | 0.00000 | 0.27369652 |
| Substrate | Glass | 1.52092 | 0.00000 | |

Figure 2:
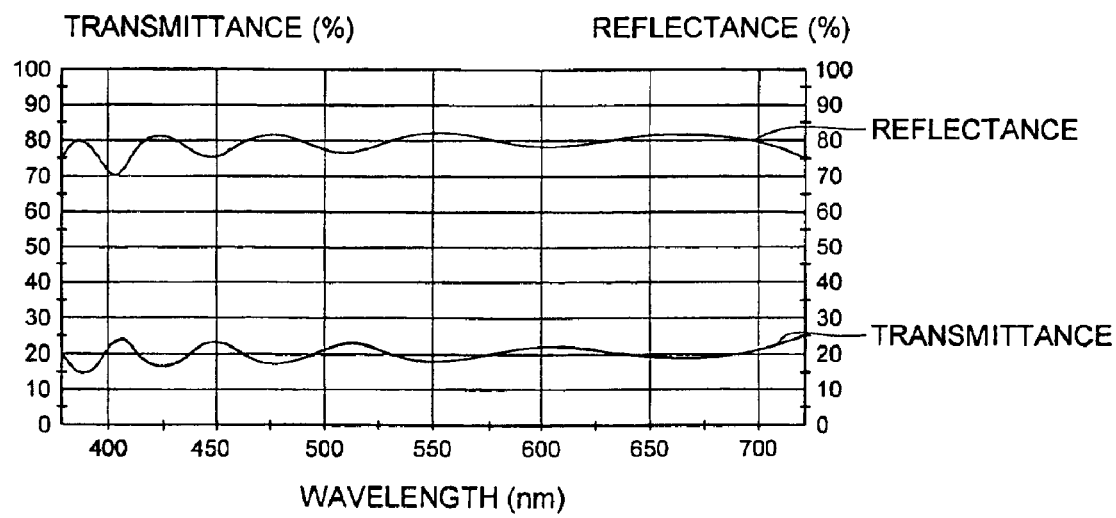
FIG. 2 is a graph showing the transmittance and reflectance of a half mirror film according to the design of Table 8 in an embodiment of the invention.

Actually measured transmittance and reflectance of the dielectric half mirror film which was formed on a glass substrate according to the design of Table 8 described above are shown by a graph in FIG. 2.

3. A design example in case of a ratio of transmittance to reflectance being 70/30 is shown in table 9. This was composed of a total of 5 layers including a low refractive index layer and a high refractive index layer being laminated on a glass substrate in the order of layer Nos. from 5 to 1.

TABLE 9

| Layer No. | Material | Refractive index | Extinction coefficient | Optical film thickness |
|---|---|---|---|---|
| 1 | TiO$_2$ | 2.34867 | 0.00037 | 0.35294937 |
| 2 | SiO$_2$ | 1.46180 | 0.00000 | 0.22012418 |
| 3 | TiO$_2$ | 2.34867 | 0.00037 | 0.26249928 |
| 4 | SiO$_2$ | 1.46180 | 0.00000 | 0.08861230 |
| 5 | TiO$_2$ | 2.34867 | 0.00037 | 0.10091448 |
| Substrate | Glass | 1.52092 | 0.00000 | |

Figure 10:
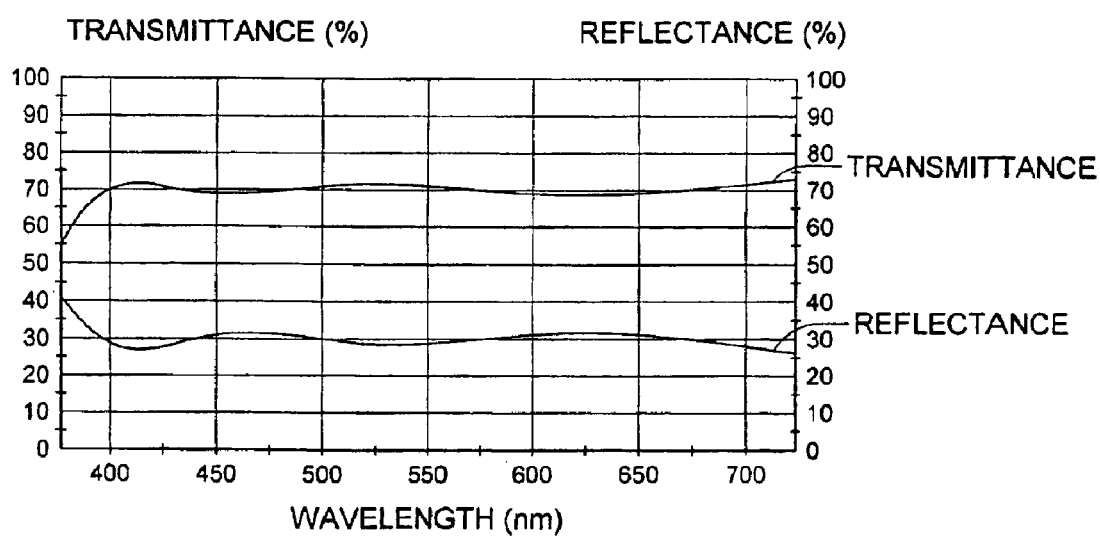
FIG. 10 is a graph showing the transmittance and reflectance of a half mirror film according to the design of Table 9 in an embodiment of the invention.

Actually measured transmittance and reflectance of the dielectric half mirror film which was formed on a glass substrate according to the design of Table 9 described above are shown by a graph in FIG. 10.

4. A design example in case of transmittance and reflectance being not kept constant and varied largely in a wavelength range of from 450 to 700 nm is shown in table 10. This was composed of a total of 10 layers including a low refractive index layer and a high refractive index layer being laminated on a glass substrate in the order of layer Nos. from 10 to 1.

TABLE 10

| Layer No. | Material | Refractive index | Extinction coefficient | Optical film thickness |
|---|---|---|---|---|
| 1 | TiO$_2$ | 2.34867 | 0.00037 | 0.29639717 |
| 2 | SiO$_2$ | 1.46180 | 0.00000 | 0.26298158 |
| 3 | TiO$_2$ | 2.34867 | 0.00037 | 0.27443390 |
| 4 | SiO$_2$ | 1.46180 | 0.00000 | 0.21066935 |
| 5 | TiO$_2$ | 2.34867 | 0.00037 | 0.56265880 |
| 6 | SiO$_2$ | 1.46180 | 0.00000 | 0.61285532 |
| 7 | TiO$_2$ | 2.34867 | 0.00037 | 0.49823492 |
| 8 | SiO$_2$ | 1.46180 | 0.00000 | 0.43447003 |
| 9 | TiO$_2$ | 2.34867 | 0.00037 | 0.26841990 |
| 10 | SiO$_2$ | 1.46180 | 0.00000 | 0.27132065 |
| Substrate | Glass | 1.52092 | 0.00000 | |

Figure 11:
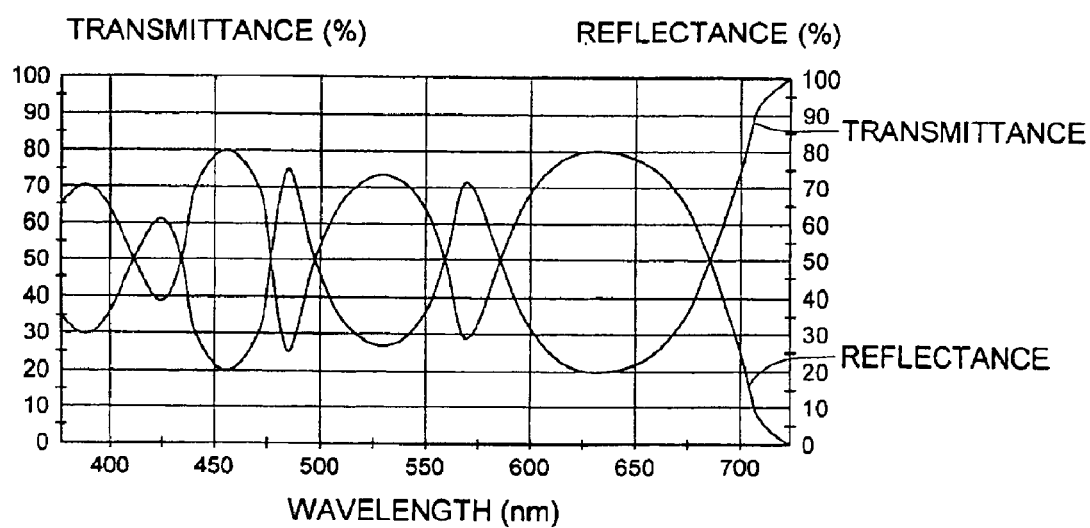
FIG. 11 is a graph showing the transmittance and reflectance of a half mirror film according to the design of Table 10 in an embodiment of the invention.

Actually measured transmittance and reflectance of the dielectric half mirror film which was formed on a glass substrate according to the design of Table 10 described above are shown by a graph in FIG. 11.

5. A design example in case of a ratio of transmittance to reflectance being 80/20 is shown in table 11. This was composed of a total of 4 layers including a low refractive index layer and a high refractive index layer being laminated on an acrylic resin substrate in the order of layer Nos. from 4 to 1.

TABLE 11

| Layer No. | Material | Refractive index | Extinction coefficient | Optical film thickness |
|---|---|---|---|---|
| 1 | Al$_2$O$_3$ | 1.67716 | 0.00000 | 0.18333673 |
| 2 | TaO$_x$ | 2.05610 | 0.00000 | 0.37815194 |
| 3 | SiO$_2$ | 1.45920 | 0.00000 | 0.23405331 |
| 4 | TaO$_x$ | 2.05610 | 0.00000 | 0.22811036 |
| Substrate | Acrylic resin | 1.50408 | 0.00000 | |

Figure 12:
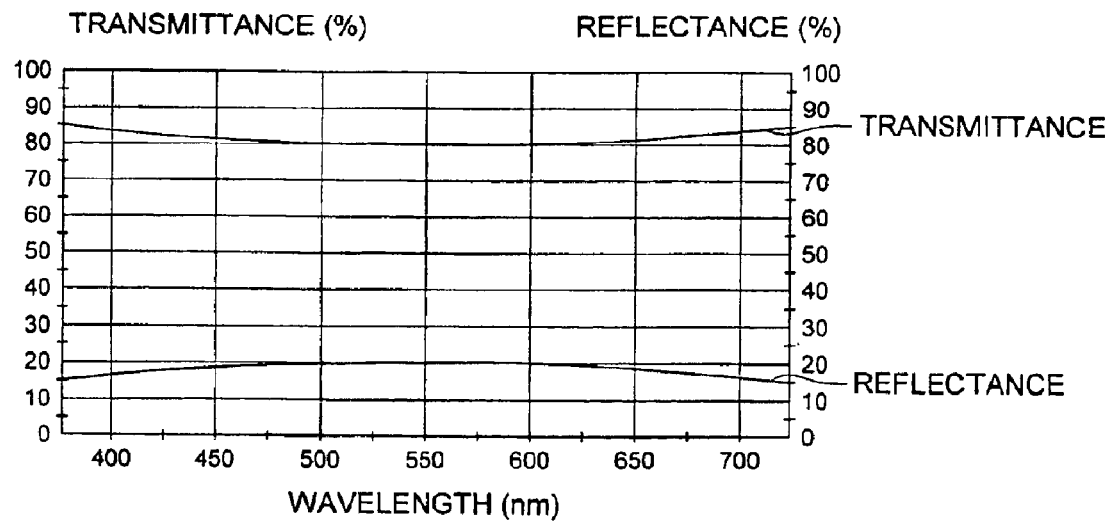
FIG. 12 is a graph showing the transmittance and reflectance of a half mirror film according to the design of Table 11 in an embodiment of the invention.

Actually measured transmittance and reflectance of the dielectric half mirror film which was formed on an acrylic resin substrate according to the design of Table 11 described above are shown by a graph in FIG. 12.

6. A design example in case of a ratio of transmittance to reflectance being 80/20 is shown in table 12. This was composed of a total of 3 layers including a low refractive index layer and a high refractive index layer being laminated on a glass substrate in the order of layer Nos. from 3 to 1.

TABLE 12

| Layer No. | Material | Refractive index | Extinction coefficient | Optical film thickness |
|---|---|---|---|---|
| 1 | SiO$_2$ | 1.46180 | 0.00000 | 0.29361307 |
| 2 | TiO$_2$ | 2.34867 | 0.00037 | 0.24928239 |
| 3 | SiO$_2$ | 1.46180 | 0.00000 | 0.40594209 |
| Substrate | Glass | 1.52092 | 0.00000 | |

Figure 13:
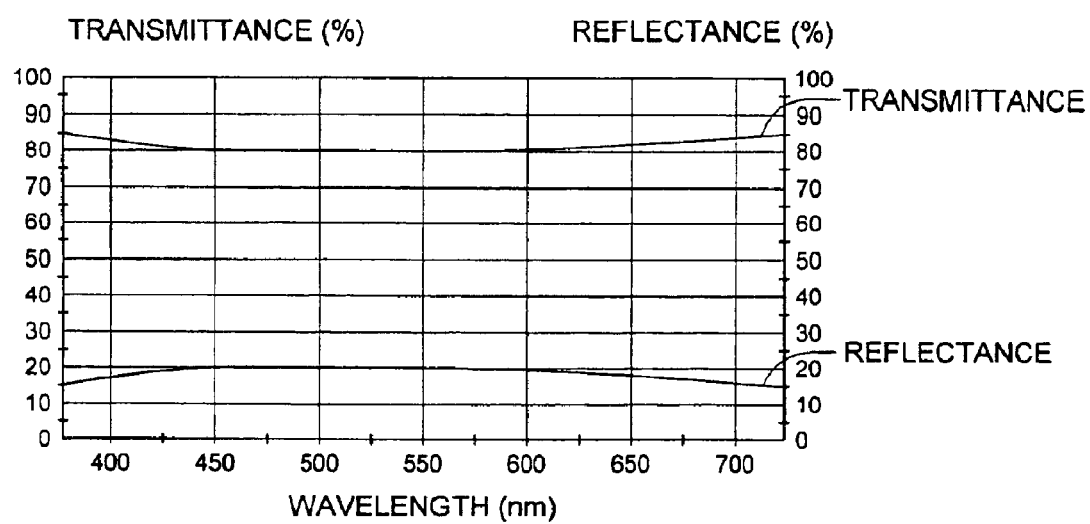
FIG. 13 is a graph showing the transmittance and reflectance of a half mirror film according to the design of Table 12 in an embodiment of the invention.

Actually measured transmittance and reflectance of the dielectric half mirror film which was formed on a glass substrate according to the design of Table 12 described above are shown by a graph in FIG. 13.

Herein, in Tables 7 to 12, each refractive index is a refractive index for the light having a wavelength of 510 nm, and an optical film thickness is expressed by (n×d/510), wherein n is a refractive index and d is an actual film thickness (unit: nm, a geographic film thickness). Further, each layer composition is shown by use of a glass substrate, however, since in practical application it is used with a color filter layer, an adhesive layer or a protective layer, having a refractive index of from 1.5 to 1.6, being provided on the outermost surface, the measurement of reflectance and transmittance was performed with light having a wavelength of from 375 nm to 725 nm at an incident angle of 0 degree and in the state of the outermost layer being in contact with a medium having a refractive index of 1.52. Further, actual film thickness can be determined within an effective area, for example, by observing a cross section of a film through an electron microscope and averaging 5 points.

Further, silicon oxide (SiO$_2$) and titanium oxide (TiO$_2$) described above are preferably added with nitrogen at the film forming process, if necessary, to form nitrides so that gas barrier effect is enhanced. In this case oxy-nitrides represented by compositions, SiO$_x$N$_y$ and TiO$_x$N$_y$ are formed. While gas barrier effect is enhanced transmittance is decreased on the contrary, when the ratio of nitrogen is increased, therefore x and y are preferably values satisfying the following equation:

$$0.4 \leq x/(x+y) \leq 0.8$$

Next, substrates which can be utilized in the embodiments of the invention will be explained.

Substrates having a light transmissive property usable in the embodiments of the invention are not specifically limited, provided that a half mirror film can be formed on the surface thereof such as substrates of a plate form, a film form, a lens form and a three-dimensional form. A thin film is formed by loading a substrate between electrodes in case that the substrate can be loaded between electrodes, or by generated plasma being sprayed onto the resin substrate in case of a substrate cannot be loaded between electrodes.

Materials composing a substrate are not specifically limited, and even a resin substrate is never deteriorated because the discharge is performed under atmospheric or sub-atmospheric pressures at low temperatures.

As a light transmissive substrate, such as glass, quarts and resin can be preferably utilized, and specifically preferably a resin material. As a resin material, cellulose ester such as cellulose triacetate; polyester; polycarbonate; polystyrene; and materials coated thereon with such as gelatin, polyvinyl alcohol (PVA), an acrylic resin, a polyester resin and a cellulose type resin can be utilized.

Further, these substrates being utilized as support materials and being coated further thereon with such as an under coat layer, other functional layers, a back coat layer and an anti-static layer can be used as a substrate. That is, materials which provide a basis, a half mirror film of the invention is formed thereon, is called a substrate.

The support materials described above (being utilized also as a substrate) include concretely polyesters such as polyethylene terephthalate and polyethylene naphthalate; polyethylene; polypropylene; cellophane; cellulose ester series such as cellulose diacetate, cellulose acetate butyrate, cellulose acetate propionate, cellulose acetate phthalate, cellulose triacetate and cellulose nitrate, and derivatives thereof; poly vinyliden chloride; polyvinyl alcohol; ethylene vinylalcohol; syndiotactic polystyrene; polycarbonate; a norbornene resin; polymehtyl pentene; polyetherketone; polyimide; polyether sulfone; polysulfone siries; polyetherketone imide; polyamide; a fuluorine resin; nylon; polymethyl methacrylate; acrylic or polyallylate series; etc.

In case that a half mirror film of the embodiment of the invention is a dielectric mirror film or a partially transmissive alloy mirror film comprising two or more laminated layers, each layer is preferably formed by exposing a light transmissive resin substrate to a reactive gas which is in a plasma state by means of discharge between the electrodes facing each other under atmospheric or sub-atmospheric pressures.

Next, a plasma discharge treatment apparatus for formation of a half mirror film applicable to the embodiment of the invention will be explained in reference to FIGS. 3 to 13.

Plasma discharge treatment apparatuses of FIGS. 3 to 8 allow formation of a half mirror film by causing discharge between a roll electrode which is an earthing electrode (a grounded electrode) and a fixed electrode which is a powered electrode arranged to face thereto, by introducing a reactive gas between the electrodes to be made in a plasma state, and by exposing a substrate which is a long roll film form (long web-shaped film) being wounded around the roll electrode to the reactive gas in a plasma state.

Figure 9:
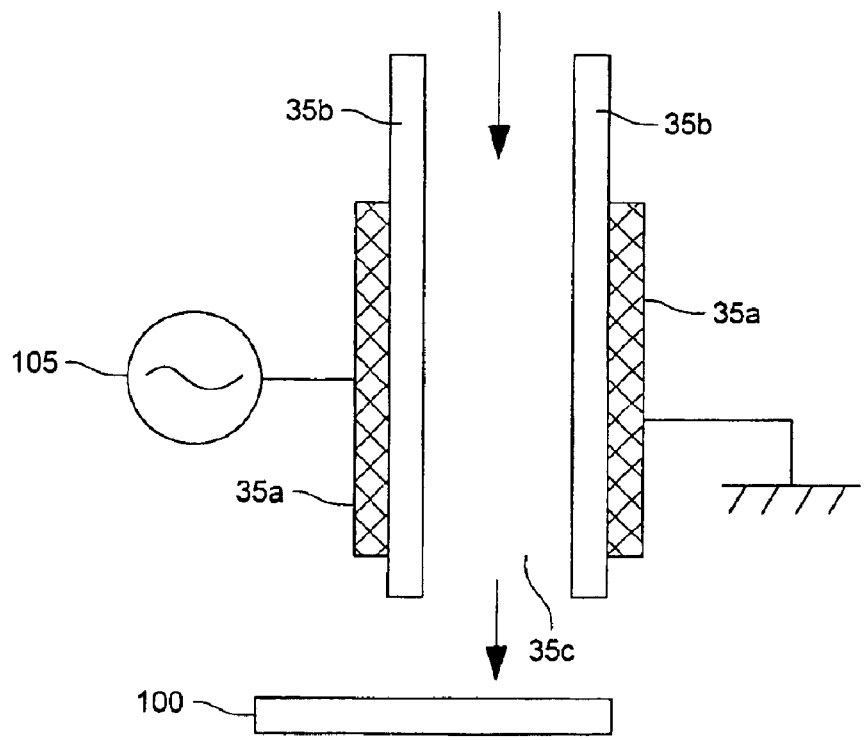
FIG. 9 is a conceptual drawing of another example of a plasma discharge treatment apparatus which can be utilized in a preparation method of a half mirror film of the invention.

Further, FIG. 9 shows another example of a plasma discharge treatment apparatus which allows to form a thin film by spraying a reactive gas, having been made in a plasma state in advance, onto the substrate, in case that a half mirror film is formed on a substrate which can not be loaded between the electrodes.

Figure 3:
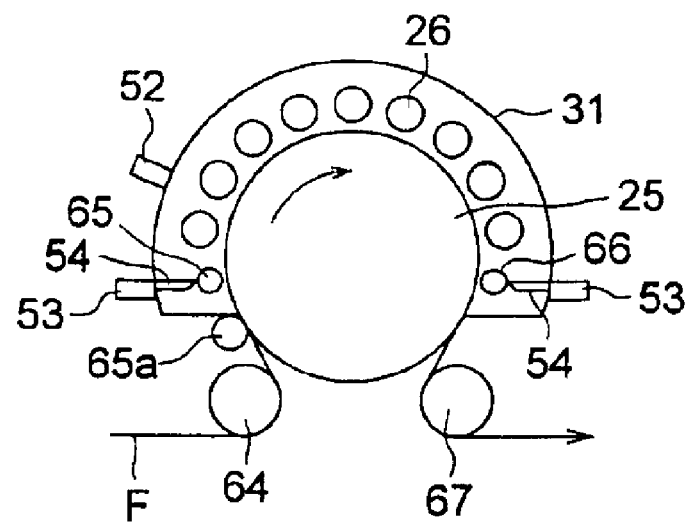
FIG. 3 is a brief drawing showing an example of a plasma discharge treatment vessel installed in a plasma discharge treatment apparatus which can be utilized in a preparation method of a half mirror film of the invention.

FIG. 3 is a brief drawing showing a plasma discharge treatment vessel of a plasma discharge treatment apparatus utilized in a method of preparing a half mirror film on a light transmissive resin substrate of a long roll form.

As shown in FIG. 3, a substrate F in a long roll film form is transported being wound around a roll electrode 25 which is rotating in the transporting direction (in the figure, clockwise). A fixed electrode 26 being composed as a form of plural cylinders is arranged to face the roll electrode 25. The substrate F wounded around the electrode 25 is pressed by nip rolls 65 and 66, guided by a guide roll 64 and a roll 65a, transported into a discharge treatment room maintained by a plasma discharge treatment vessel 31, and treated in a plasma state. Subsequently, the substrate is transported through a guide roll 67 to the next process.

Further, partition plates 54 each, being arranged in the neighborhood of nip rolls 65 and 66, inhibit the air accompanied with a substrate F from invading into a plasma discharge treatment vessel 31. The air accompanied with a substrate F is preferably depressed to not more than 1 volume % and more preferably to not more than 0.1 volume %, based on the total volume of the air in a plasma discharge treatment vessel 31, and it can be achieved by nip rolls 65 and 66.

Herein, a mixed gas (an organic gas containing an inert gas and a reactive gas such as an organic fluorine compound, titanium compound or silicon compound) utilized for a plasma treatment is introduced from an air supply inlet 52 into a plasma discharge treatment vessel 31 and the gas after the treatment was evacuated through an air outlet 53.

Figure 4:
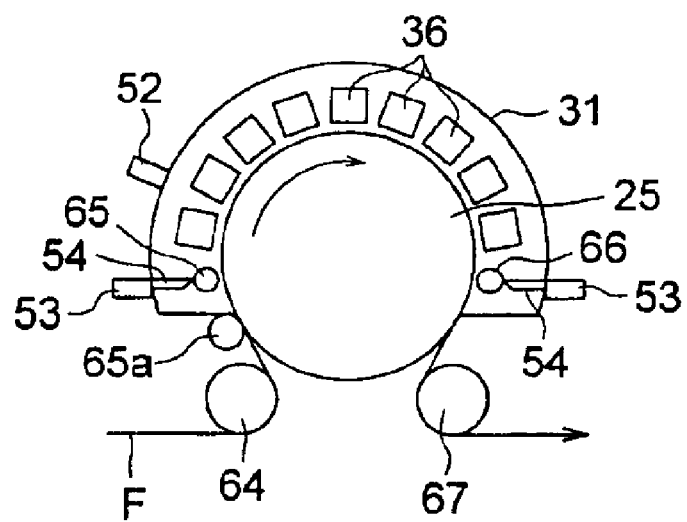
FIG. 4 is a brief drawing showing another example of a plasma discharge treatment vessel installed in a plasma discharge treatment apparatus which can be utilized in a preparation method of a half mirror film of the invention.

FIG. 4, similar to FIG. 3, is a brief drawing of another example of a plasma discharge treatment vessel which is equipped in a plasma discharge treatment apparatus utilized for a preparation method of a half mirror film according to an embodiment of the invention. An electrode 26 which is fixed facing to a roll electrode 25 is a cylindrical electrode in FIG. 3, however, a square pole electrode is utilized in FIG. 4. Since a square pole electrode 36 is effective to widen a discharge area compared to a cylindrical electrode 26 as shown in FIG. 4, it is preferably utilized in a preparation method of a half mirror film of the invention.

Further, in a preparation method of a half mirror film of the invention, it is preferable to apply a high power electric field between a roll electrode 25 and an electrode 26 in order to form a highly functional half mirror film having minuteness and high homogeneity of film thickness. A high power electric field is preferably supplied between the electrodes facing each other at a high frequency voltage of over 100 kHz and an electric power of not less than 1 W/cm$^2$.

The upper limit of a frequency of a high frequency voltage applied between the electrodes is preferably not more than 150 MHz. Further, the lower limit of a frequency of a high frequency voltage is preferably not less than 200 kHz, and more preferably not less than 800 kHz.

Further, the lower limit of an electric power supplied between the electrodes is preferably not less than 1.2 W/cm$^2$, and the upper limit is not more than 50 W/cm$^2$, and more preferably not more than 20 W/cm$^2$. Herein, an applying area (/cm$^2$) of voltage indicates an area of a region where discharge is generated.

Further, high frequency voltage applied between the electrodes may be of intermittent pulse waves or of continuous sine waves, however, preferably of sine waves to obtain a higher effect of the invention.

These electrodes are preferably ones composed of a metallic base material covered with a dielectric. It is preferable to cover with a dielectric at least on one of a powered electrode and an earthing electrode which are facing each other, more preferable to cover both of a powered electrode and an earthing electrode (grounded electrode) which are facing each other. A dielectric is preferably an inorganic substance having a specific dielectric constant of from 6 to 45, and such dielectrics include ceramics such as alumina and silicon nitride, or glass lining materials such as silicate type glass and borate type glass.

Further, in case of exposing a substrate to a plasma while being loaded between the electrodes or transported between the electrodes, it is possible to maintain a thickness of a dielectric and a gap between electrodes and to stabilize the state of discharge, by not only a substrate being designed to fit roll electrode specifications in which the substrate can be transported in contact with one of a pair of electrodes, but also by the surface of dielectric being finished by polishing to make the surface roughness of the electrode Rmax (JIS B 0601) not more than 10 μm; and it is possible, further, to enhance durability greatly by diminishing distortion or cracking due to thermal shrinkage differences or residual stresses and by being covered with an inorganic dielectric which is not porous and has high precision.

Further, in preparation of an electrode by means of covering a dielectric on a metallic base material at high temperatures, it is necessary to finish by polishing at least the side, which contacts with a substrate, of a dielectric, and to minimize the difference of thermal expansion between a metallic base material of an electrode and a dielectric. For this purpose, in the preparation method, it is preferable to provide lining with an inorganic material on the surface of a base material, in which mixing amount of foam is controlled, as a stress absorbing layer; specifically preferable is glass prepared by a fusing method well known as such as porcelain enamel as the material, and a superior electrode having minuteness and no appearance of such as cracking can be prepared by adjusting the mixing amount of foam in the undermost layer, which contacts with a conductive metallic base material, to from 20 to 30 volume %, and in other layers after this to not more than 5 volume %.

Further, another method to cover a base material of an electrode with a dielectric is to perform melt spray of a ceramic until as minute as not more than 10 volume % of a porosity, followed by a sealing treatment with an inorganic material which can be cured by a sol-gel reaction. Herein, thermal cure or UV cure is preferred to accelerate a sol-gel reaction, and further the dilution of a sealing solution to repeat coating and cure successively several times can enhance inorganization further to prepare an electrode free of deterioration and having minuteness.

Figure 5:
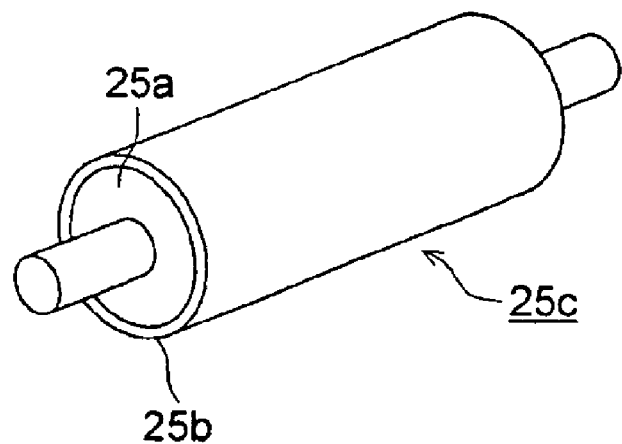
FIGS. 5(a) and (b) are brief drawings showing an example of a cylinder type roll electrode which can be utilized in a plasma discharge treatment according to the invention.
Figure 5:
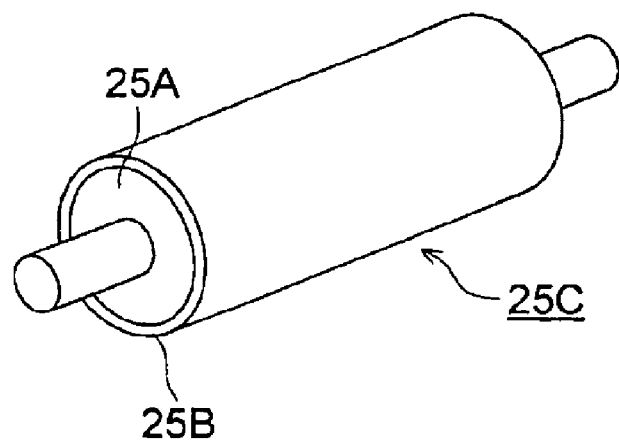

Next an electrode will be explained according to FIG. 5, FIG. 6 and FIG. 7. FIGS. 5(a) and (b) each are brief drawings to show a cylindrical roll electrode described above, FIGS. 6(a) and (b) each are brief drawings to show a cylindrical fixed electrode, and FIGS. 7(a) and (b) each are brief drawings to show a square rod type fixed electrode.

As shown in FIG. 5(a), a roll electrode 25c which is an earthing electrode is composed of a combination of a conductive base material 25a such as metal, after being melt sprayed with ceramics, covered with a ceramic cover treated dielectric which is subjected to a sealing treatment with an inorganic material. It is coated with a ceramic cover treated dielectric at 1 mm of one side thickness, prepared so as to make a roll diameter 200 φ and is grounded to earth. As shown in FIG. 5(b), it may also be composed of a roll electrode 25C, a combination of a conductive base material 25A such as metal covered with a lining treated dielectric 25B which is provided with an inorganic material by lining.

As a lining material described above, are preferably utilized such materials as silicate type glass, borate type glass, phosphate type glass, germanate type glass, tellurite glass, alminate glass and vanadate glass, and among them is more preferably utilized borate type glass since it can be easily processed. A conductive base material such as metal 25a and 25A, includes metals such as silver, platinum, stainless steel, aluminum and iron, and stainless steel is preferred in respect to processing. Further, as ceramic materials utilized for melt spray, alumina, silicon nitride, etc. are preferred, and among them more preferred is alumina because of easy processing. Herein, in embodiments of the invention, a jacket roll base material which is made of stainless steel and provided with a cooling mean by cooled water is utilized as a base material of a roll electrode (the illustration being omitted).

FIGS. 6(a), (b), and FIGS. 7(a), (b) show fixed electrodes 26c, 26C, 36c and 36C, which are powered fixed electrodes, and are composed of a combination similar to a roll electrode 25C. That is, stainless steel pipes 26a, 26A, 36a and 36A each are covered with dielectrics 26b, 26B, 36b and 36B similar to those described above respectively, and provided with a cooling mean by cooled water during discharge. Herein, the dielectric treated with a ceramic is prepared so as to be 12φ or 15φ after the treatment, and the number of the electrodes is 14 being arranged along the circumference of the roll electrode described above.

A source of electric power which apply voltage to a powered electrode is not specifically limited, and can be utilized a high frequency electric source (200 kHz) produced by Pearl Kogyo Co., a high frequency electric source (800 kHz) produced by Pearl Kogyo Co., a high frequency electric source (13.56 MHz) produced by Nippon Denshi Co. and a high frequency electric source (150 MHz) produced by Pearl Kogyo Co. etc.

Figure 8:
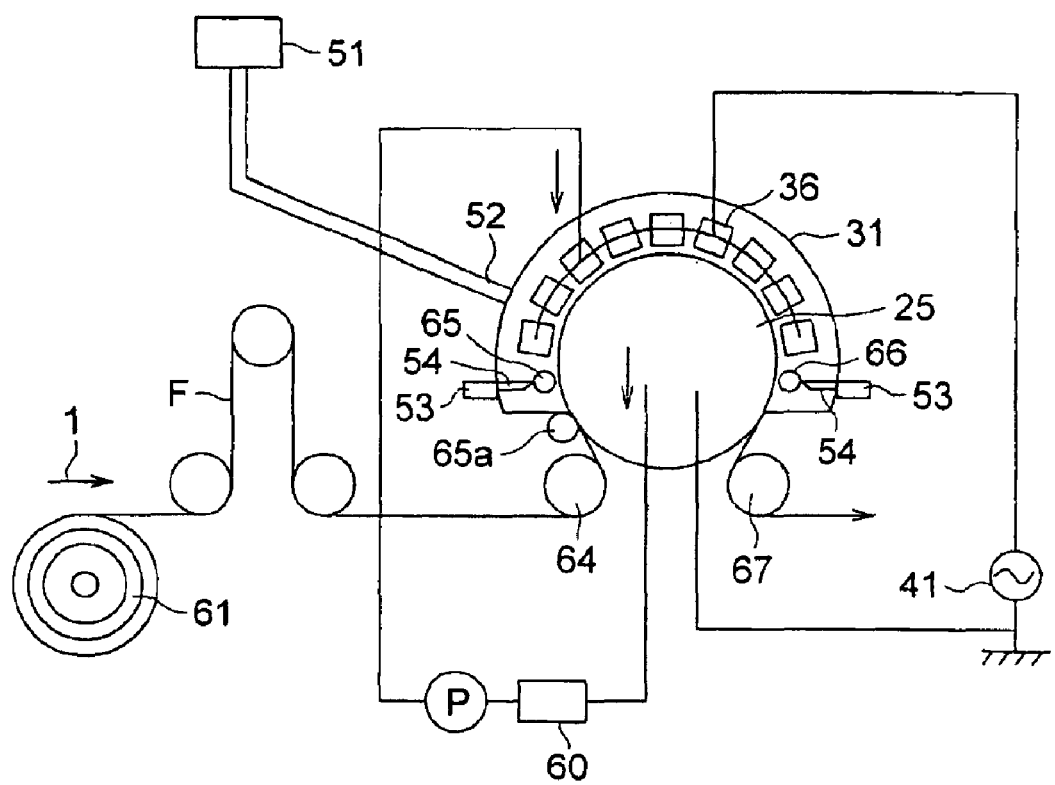
FIG. 8 is a conceptual drawing of an example of a plasma discharge treatment apparatus which can be utilized in a preparation method of a half mirror film of the invention.

FIG. 8 is a conceptual drawing of a plasma discharge treatment apparatus utilized in the invention. In FIG. 8, the portion of a plasma discharge treatment vessel 31 has a composition similar to that of FIG. 4, however, are further arranged apparatus constitutions such as a gas generating apparatus 51, a electric source 41 and an electrode cooling unit 60. As a cooling agent for an electrode cooling unit, are utilized insulating materials such as distilled water and oil.

Figure 6:
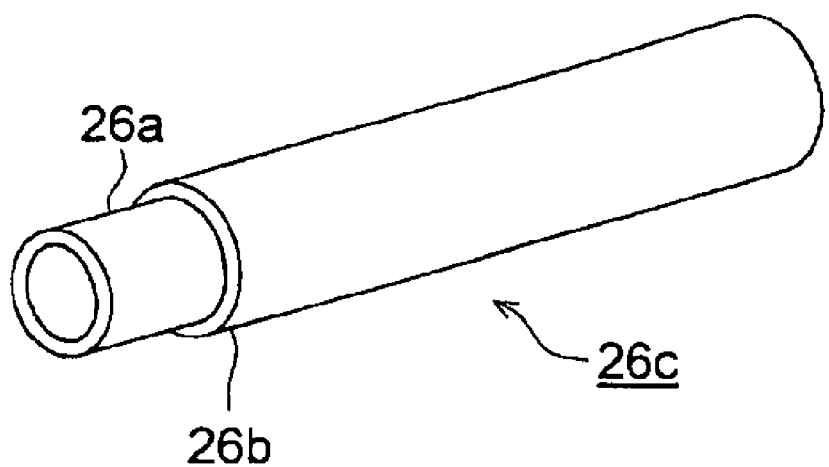
FIGS. 6(a) and (b) are brief drawings showing an example of a fixed type cylindrical electrode which can be utilized in a plasma discharge treatment according to the invention.
Figure 6:
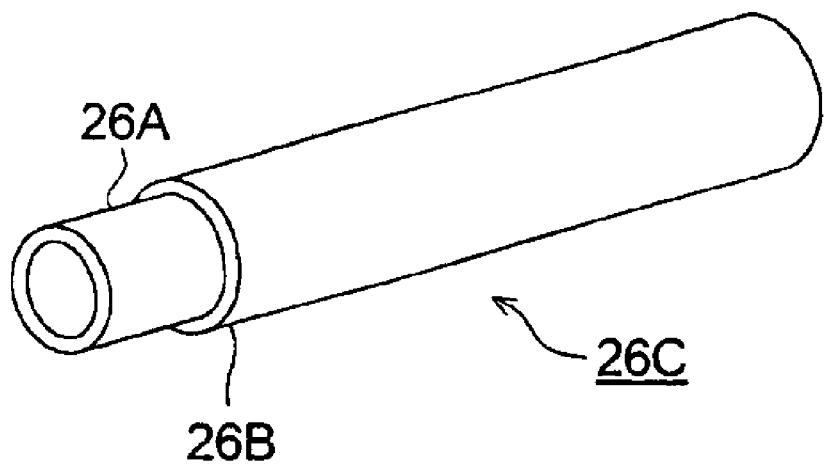
Figure 7:
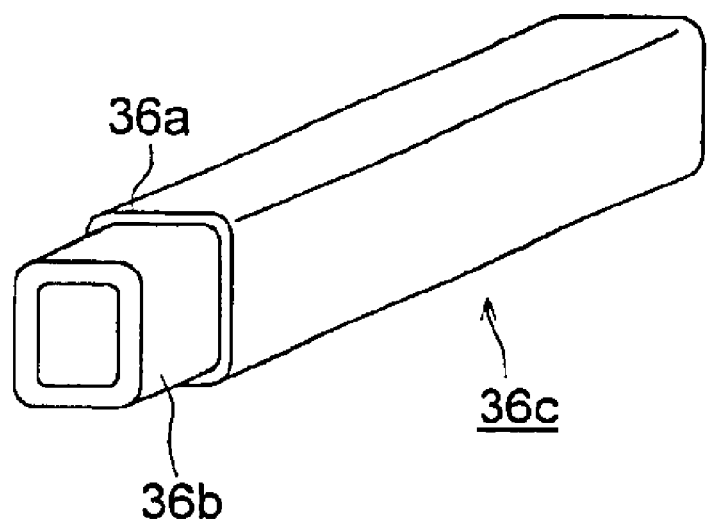
FIGS. 7(a) and (b) are brief drawings showing an example of a fixed type square rod electrode which can be utilized in a plasma discharge treatment according to the invention.
Figure 7:
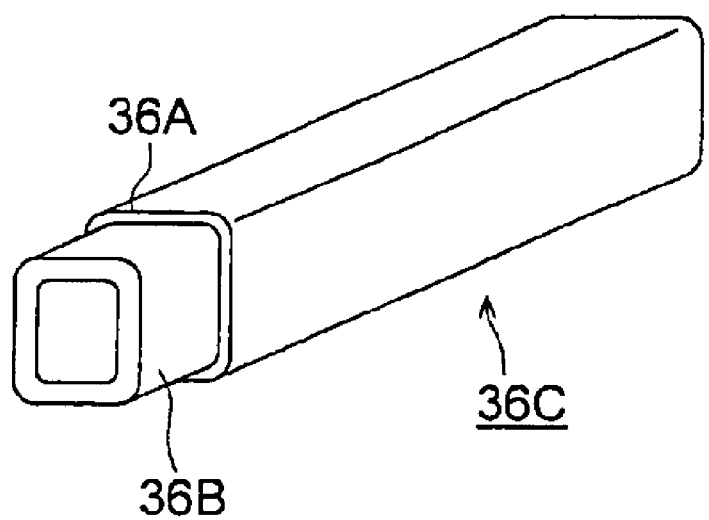

The electrodes 25 and 36 shown in FIG. 8 are similar to those shown in such as FIGS. 5 to 7, and the gap between electrodes facing each other is, for example, set at 1 mm. The distance between the electrodes is determined in consideration of such as the thickness of a solid dielectric provided on a base material of the electrode, a magnitude of applied voltage and the purpose of plasma application. For example, as the minimum distance between the solid dielectric and the electrode in case of a solid dielectric is provided on one of the electrodes described above, and the distance between the solid dielectrics each other in case of a solid dielectric is provided on both of the electrodes described above, it is, in either case, preferably from 0.5 to 20 mm, and specifically preferably 1 mm±0.5 mm, in respect to performing homogeneous discharge.

In a plasma discharge treatment apparatus being composed as described above, a roll electrode 25 and fixed electrodes 36 being arranged at prescribed positions in a plasma discharge treatment vessel 31, a mixed gas generated in a gas generating apparatus 51 is introduced through an air supply inlet 52 into a plasma discharge treatment vessel 31 to fill a plasma discharge treatment vessel 31 with a mixed gas utilized for a plasma treatment and evacuated through an evacuation outlet 53. Next, voltage is applied to electrodes 36 by an electric source 41 while a roll electrode 25 being grounded, and a plasma is generated by electric discharge.

Herein, a substrate F is supplied from a parent roll of a substrate 61, and the substrate F is transported, via a guide roll 64, between the electrodes in a plasma discharge treatment vessel 31 in a state of one-side surface contact (in contact with a roll electrode 25). A substrate F is subjected to a discharge treatment on the surface thereof by plasma while being transported, and transported to the next process via a guide roll 67. Herein, a substrate F is subjected with a discharge treatment only on the surface which is not in contact with a roll electrode 25.

The value of voltage applied to fixed electrodes 36 by an electric source 41 is suitably decided, and, for example, the voltage is adjusted at around from 0.5 to 10 kV and an electric source frequency at over 100 kHz and not more than 150 MHz. Herein, as for an applying method of an electric source, either of a continuously oscillating mode which is a sine wave state and called as a continuous mode or a discontinuously oscillating mode which performs ON/OFF intermittently may be applied, however, a continuous method can provide a film having minuteness and superior quality.

As a plasma discharge treatment vessel 31, is preferably utilized a treatment vessel made of Pylex (R) glass, and also may be utilized a metallic one provided that insulation from an electrode is assured. For example, a frame made of aluminum or stainless steel of which inside is provided with a polyimide resin lining, and the metal frame which is provided with an insulating property by ceramics melt spray, may be also preferably utilized.

Further, it is preferable to adjust the temperature of a substrate during treatment in a plasma state to from ordinary temperatures (from 15° C. to 25° C.) to 250° C. in order to minimize the effect to a substrate during the treatment in a plasma state, and more preferable to from ordinary temperatures to 100° C. To adjust the temperature to the range described above, if necessary, the electrodes and the substrate is treated in a plasma state while being cooled by a cooling mean.

Next, a preparation method of a half mirror film by another plasma discharge treatment apparatus in FIG. 9 will be explained. A mixed gas of an inert gas and a reactive gas is introduced from upper portion of the figure into a discharge room 35c of a slit form comprised of a metallic base material 35b covered with a dielectric 35a, the reactive gas is made into a plasma state by applying a high frequency voltage by use of an electric source 105, and a half mirror film is formed on a substrate 100 by spraying the reactive gas in a plasma state onto the substrate 100.

In the invention, the treatment in a plasma state is performed under atmospheric pressures or sub-atmospheric pressures, herein, sub-atmospheric pressures represent pressures from 20 kPa to 110 kPa, however, preferably from 93 kPa to 104 kPa in order to obtain the effects of the invention preferably.

Further, in an electrode for electric discharge according to a preparation method of a half mirror film of the invention, the maximum height of a surface roughness, which is defined by JIS B 0601, of at least the side of an electrode in contact with a substrate is preferably adjusted to not more than 10 μm in respect to obtaining the effects described in the invention, however, the maximum value of a surface roughness is, more preferably, adjusted to not more than 8 μm, and specifically preferably to not more than 7 μm. Further, a mean center line surface roughness (Ra) defined by JIS B 0601 is preferably not more than 0.5 μm, and more preferably not more than 0.1 μm.

Next, a mixed gas according to a preparation method of a half mirror film of the invention will be explained. In performing a preparation method of a half mirror film according to the invention, the gas utilized is varied depending on the kind of a half mirror film to be provided on a resin substrate having light transmissive property, it is basically a mixed gas of an inert gas and a reactive gas which forms a half mirror film. A reactive gas is preferably contained at from 0.01 to 10 volume % based on a mixed gas. A film thickness of a thin film obtained is from 0.1 nm to 1000 nm.

The inert gas described above includes elements of the 18th group of the periodic table, concretely such as helium, neon, argon, krypton, xenon and radon, however, helium and argon are preferably utilized to obtain the effect described in embodiments of the invention.

As a reactive gas the following gases can be utilized. In case of a half mirror film being a partially transmissive alloy mirror, organometallic film compounds containing Au, Ag, Cu, Pt, Ni, Pd, Se, Te, Rh, Ir, Ge, Os, Ru, Cr, W, Ir, Sn or Zn. In this case the reaction system is performed in a reductive atmosphere. Further, in case of a half mirror film being a dielectric mirror in which layers having different refractive indexes are laminated, for example, a reactive gas containing an organofluorine compound, silicon compound (a low refractive index layer) or titanium compound (a high refractive index layer) can be utilized to prepare a half mirror film.

As organofluorine compounds, are preferably utilized such as a fluorocarbon gas and a fluorohydrocarbon gas. A fluorocarbon gas includes terafluorocarbons and hexafluorocarbons, concretely such as tetrafluoromethane, tetrafluoroethylene, hexafluoropropylene and octafluorocyclobutane. Further, a fluorohydrocarbon gas includes such as difluoromethane, tetrafluoroethane, tetrafluoropropylene and trifluoropropylene.

Further, halogenated compounds of fluorohydrocarbon compounds such as monochlorotrifluoromethane, monochlorodifluoromethane and dichlorotetrafluorocyclobutane, and fluorine substituted compounds of organic compounds such as alcohols, acids and ketones, can be utilized, however, the invention is not limited thereby. These compounds may be provided with ethylenicaly unsatulated groups in the molecule, and can be utilized alone or in combinations.

In case of utilizing the organofluorine compounds described above in a mixed gas, the content of an organofluorine compound in a mixed gas is preferably from 0.1 to 10 volume %, and more preferably from 0.1 to 5 volume %, in respect to forming a uniform thin layer on a substrate by a treatment in a plasma state.

Further, in case of an organofluorine compound according to embodiments of the invention being a gas under ordinary temperatures and ordinary pressures, since it can be utilized as a composing component of a mixed gas as it is, a method according to embodiments of the invention can be most easily carried out. However, in case of an organofluorine compound is a liquid or solid under ordinary temperatures and ordinary pressures, it may be utilized after gasification by means of such as heating and diminished pressure, or by being dissolved in suitable solvents.

In case of using a titanium compound described above in a mixed gas, the content of a titanium compound in a mixed gas is preferably from 0.1 to 10 volume %, and specifically preferably from 0.1 to 5 volume %, in respect to forming a uniform thin layer on a substrate by a treatment in a plasma state.

Further, hardness of a half mirror film can be enhanced remarkably by containing from 0.1 to 10 volume % of a hydrogen gas in a mixed gas described above.

Further, the reaction is accelerated and a half mirror film having minuteness as well as superior quality can be formed, by containing from 0.01 to 5 volume % of a component selected from oxygen, ozone, hydrogen peroxide, carbon dioxide, carbon monoxide, hydrogen and nitrogen in a mixed gas described above.

As a silicon compound and a titanium compound described above, metal hydride compounds and metal alkoxides are preferably utilized in respect to handling, and metal alkoxides are preferably utilized because of no generation of a corrosive or poisonous gas and minimized contamination in processes.

Further, to introduce a silicon compound or a titanium compound described above into a discharge room between the electrodes, both compounds may be any state of a gas, liquid and solid under ordinary temperatures and ordinary pressures. In case of a gas, it can be introduced into a discharge room as it is, while, in case of a liquid or solid, it can be introduced after gasification by means of such as heating, diminished pressure and irradiation with ultra-sonic waves. In case of utilizing a silicon compound or a titanium compound after gasification, metal alkoxides such as tetraethoxy silane and tetraisopropoxy titanium, which are liquid under ordinary temperatures and have a boiling point of not higher than 200° C., are suitably utilized in the formation of a half mirror film. The metal alkoxides may be used by being diluted with solvents, and the solvents utilized include methanol, ethanol and n-hexane and mixtures thereof. Herein, since these solvents are decomposed into a molecular or atomic state during a treatment in a plasma state, the effect on the formation of layers on a substrate and on the layer compositions can be almost neglected.

As a silicon compound described above, for example, are preferably utilized organometallic compounds such as dimethyl silane, tetramethyl silane, metal hydride compounds such as monosilane and disilane, metal halogenide compounds such as dichlorosilane and trichlorosilane, alkoxy silanes such as tetramethoxy silane, tetraethoxy silane and dimethylethoxy silane, and organo silane, etc., however, it is not limited thereby. Further, they can be utilized in combinations suitably.

In case of utilizing silicon compounds described above in a mixed gas, the content ratio of a silicon compound in a mixed gas is preferably from 0.1 to 10 volume %, and more preferably from 0.1 to 5 volume %, in respect to forming a homogeneous layer on a substrate by a treatment in a plasma state.

As a titanium compound described above, are preferably utilized organometallic compounds such as tetradimethylamino titanium, metal hydrides such as monotitane and dititane, metal halogenides such as titanium dichloride, titanium trichloride and titanium tetrachloride, and metal alkoxides such as titanium tetraethoxide, titanium tetraisopropoxide and titanium tetrabutoxide, however, it is not limited thereby.

Further, a tantalum compound described above, are preferably utilized organometallic compounds such as tetradimethylamino tantalum, metal hydrides such as monotantale and ditantale, metal halogenides such as tantalum dichloride, tantalum trichloride and tantalum tetrachloride, and metal alkoxides such as tantalum tetraethoxide, tantalum tetraisopropoxide and tantalum tetrabutoxide, however, it is not limited thereby.

Further, a aluminu compound described above, are preferably utilized organometallic compounds such as tetradimethylamino aluminum, metal hydrides such as monoalumine and dialmine, metal halogenides such as alminum dichloride, aluminum trichloride and aluminum tetrachloride, and metal alkoxides such as aluminum tetraethoxide, aluminum tetraisopropoxide and aluminum tetrabutoxide, however, it is not limited thereby.

In case of adding an organometallic compound in a reactive gas, for example, the organometallic compound can contain a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu. The organometallic compound is more preferably selected from metal alkoxides, alkyl metals and metal complexes.

When a half mirror film is a dielectric mirror film in an embodiment of the invention, a high refractive index layer comprising titanium oxide having a refractive index of from 1.85 to 2.60 as a main component and a low refractive index layer comprising silicon oxide having a refractive index of from 1.30 to 1.57 as a main component are preferably provided successively on the surface of a resin substrate or glass substrate. It is preferable to provide a high refractive index layer and a low refractive index layer by a treatment in a discharge state immediately after providing an UV curable resin layer on a film comprised of a resin substrate, which achieves more enhanced adhesion between a half mirror film and a resin substrate to decrease generation of cracking. A high refractive index layer is preferably comprised of titanium oxide as a main component, and specifically preferably has a refractive index of not less than 2.2.

When a half mirror film is a dielectric mirror film in an embodiment of the invention, the carbon content ratio of a high refractive index layer and a low refractive index layer both are preferably from 0.2 to 5 volume % for adhesion with an under layer and film flexibility (prevention of cracking). They are more preferably from 0.3 to 3 volume %. That is, because a layer formed by a treatment in a plasma state contains organic compounds (carbon atoms) and the content range provide a film with flexibility, superior adhesion of a film is preferably achieved. When the content ratio of carbon is too large, it is not preferred because of a tendency of easy fluctuation of a refractive index in aging.

EXAMPLES

Next, the invention will be further detailed according to examples.

Example 1

A commercially available PES (polyether sulfone) film being used as a light transmissive substrate, an optical member provided with a half mirror film comprising the total of 13 layers of laminated titanium oxide and silicon oxide similar to those described in Table 7 are evaluated in case of being prepared by use of a plasma discharge treatment apparatus of FIG. 8 (example 1) and in case of film preparation by evaporation (comparative example), with respect to such as an optical performance and adhesion property.

Film Forming Conditions of an Atmospheric Pressure Plasma Method in Example 1

In FIG. 8, a jacket roll base material made of stainless steel and provided with a cooling mean by cooled water (a cooling mean is not illustrated in FIG. 8) was covered with 1 mm thick of alumina by seramic melt spraying, thereafter, being coated with a solution of tetramethoxy silane diluted with ethyl acetate and dried, and was subjected to a sealing treatment by curing with UV irradiation to prepare a roll electrode 25 having a dielectric of which surface having been smoothened so as to make Rmax 5 µm, and was grounded to earth. On the other hand, as a powered electrodes 36, square stainless steel pipes were covered with a dielectric similar to one described above to be a group of electrodes.

Herein, as an electric source for plasma generation utilized was a high frequency electric source JRF-10000, produced by Nippon Denshi Co., Ltd., to supply an electric power of 20 W/cm2 at a voltage with a frequency number of 13.5 MHz.

Reactive Gas

The composition of a mixed gas (a reactive gas) which was used in a plasma treatment (to be treated in a plasma state) is described below.

For Preparation of a Silicon Oxide Layer

Inert gas: argon of 98.25 volume %

Reactive gas 1: a hydrogen gas of 1.5 volume %

Reactive gas 2: a tetramethoxy silane vapor of 0.25 volume % (having been bubbled with an argon gas)

For Preparation of a Titanium Oxide Layer

Inert gas: argon of 98.75 volume %

Reactive gas 1: a hydrogen gas (1 volume % bsed on the total reactive gas)

Reactive gas 2: a tetraisopropoxy titanium vapor (a liquid heated at 150° C. having been bubbled with an argon gas) of 0.25 volume % based on the total reactive gas A half mirror film was prepared on a film substrate by a continuous plasma treatment at atmospheric pressures, with the reactive gas described above and under the conditions described above. A carbon content ratio of the half mirror film according to a measuring method of a carbon content ratio described below was measured to be 0.2 weight %.

Film preparation conditions of an evaporation method in the comparative example

A half mirror film was prepared by laminating a silicon oxide layer and a titanium oxide layer similar to those of example 1 by use of a vacuum film forming apparatus LOAD-LOCK TYPE VACUUM ROLL COATER EWA-310 produced by Nippon Shinku Co. A carbon content ratio of the half mirror film according to a measuring method of a carbon content ratio described below was measured to be not more than a limit of detection. Measurement of a carbon content ratio of a half mirror film The carbon content ratios of half mirror films prepared in Example 1 and the comparative example described above were measured by use of an XPS surface analyzing apparatus. An XPS surface analyzing apparatus is not specifically limited, and any kind of apparatuses can be utilized. However, in the examples, ESCALAB-200R produced by Scientifix Co. was utilized. The measurement was performed using Mg as an X-ray anode and at an output of 600 W (acceleration voltage: 15 kV, emission current: 40 mA). Energy resolution was adjusted to from 1.5 to 1.7 eV when it was defined by a half value width of a clean AG3d5/2 peak. It is necessary to etch and remove the surface layer equivalent to from 10 to 20% of a thickness of the thin film in order to eliminate the effect of contamination. To remove the surface layer, an ion gun capable of using rare-gas ions is preferably utilized, and ion kinds such as He, Ne, Ar, Xe and Kr can be applied. In the measurement, Ar ion etching was utilized to remove the surface layer.

First, measurement was performed, at a data reading interval of 1.0 eV, in a bonding energy range of from 0 eV to 1100 eV, to determine what kinds of elements were detected. Next, for every elements except the etching ion kinds, the spectrum of each element was measured by a narrow scanning of a photoelectron peak which gave the maximum strength at a data reading interval of 0.2 eV. After the obtained spectra were transported to COMMON DATA PROCESSING SYSTEM (being preferably Ver. 2.3 or the subsequent versions) produced by VAMAS-SCA-JAPAN Co. to prevent causing differences in the calculated content ratio depending on differences of measurement systems or computers, values of a carbon content ratio were determined as atomic concentrations.

Further, before the quantitative processing, 5 points smoothing process was performed by calibration of a count scale for each element. In the quantitative processing, peak area strength (cps*eV) from which background had been removed was used. For the background processing, the method by Shirley was applied. Shirley's method may be referred to D. A. Shirley, Phys. Rev., B5, 4709 (1972).

Optical Performance

The half mirror film prepared by an atmospheric pressure plasma method of the example showed superior uniformity on the surface of a substrate in respect with both reflectance and transmittance, when each reflectance and transmittance was measured in a range of from 400 nm to 700 nm. On the other hand, a half mirror film prepared by the evaporation method of the comparative example showed partial cracking and slight decrease of uniformity of reflectance and transmittance.

Peeling Test

The checker test based on JIS K5400 was performed. 11 cuts at an angle of 90° against the surface both horizontally and longitudinally at intervals of 1 mm were made by use of a single-edged razor on the surface of thin films prepared to form 100 checks of a 1 mm square. Commercially available cellophane tape was pasted up thereon, an edge of the tape being held by hand, and pulled strongly to make the tape be peeled off, and the ratio of the area peeled off from the cut lines versus the pasted area the tape was ranked into to the following three ranks. The results of peeling test are shown in the following Table 13.

A: no peeling was observed

B: the ratio of a peeled area was less than 10%

C: the ratio of a peeled area was not less than 10%

TABLE 13

| Method of film preparation | Example 1 Plasma method in atmospheric pressures | Comparative example Evaporation method |
| --- | --- | --- |
| Peeling test result | A | B |

The half mirror film prepared according to the example was equal to or superior to that of the comparison in every evaluation item. In addition, the formation speed of a half mirror film of the example is faster by not less than 15 times compared to the comparison, and the productivity was extremely high.

Examples 2 to 5

Next, as Examples 2, 3, 4 and 5, each optical member having a half mirror film formed in a similar manner to example 1, except that, the electric source was changed, a high frequency voltage applied and an electric power applied were changed, and the carbon content ratio of a half mirror film was varied as shown in Table 14, was prepared.

For Examples 1 to 5 and the comparative example described above, the following measurement of abrasion resistance was performed and the results are shown in Table 14.

Measurement of Abrasion Resistance

The number of abrasion lines produced was measured after a probe, pasted with steel wool in the surface of 1×1 cm, was pressed with a weight of 250 g against a thin film surface of an optical film and was moved back and forth 10 times.

TABLE 14

|  | Film forming method | Frequency number | Electric power (W/cm$^2$) | Carbon content ratio (weight %) | Abrasion resistance (number of lines) |
|---|---|---|---|---|---|
| Example 1 | * | 13.56 MHZ | 20 | 0.2 | 1 |
| Example 2 | * | 800 kHz | 20 | 0.3 | 0 |
| Example 3 | * | 800 kHz | 2 | 3 | 0 |
| Example 4 | * | 200 kHz | 2 | 5 | 1 |
| Example 5 | * | 100 kHz | 0.8 | 6 | 10 |
| Comparative example | Evaporation method | — | — | Not detected | 28 |

*: Plasma method in atmospheric pressures

It has been proved that samples having a carbon content in a half mirror film of from 0.2 to 5 weight % are provided with superior performance in abrasion resistance.

Example 6

Next, in Example 6, a half mirror film was formed on a glass substrate in a similar manner to example 1 by use of a plasma discharge treatment apparatus of FIG. 9, and results nearly equal to those of example 1 could be obtained by evaluation similar to that of example 1. Further, when a half mirror film was prepared on a glass substrate by a evaporation method similar to that of the comparative example described above, the differences were more remarkable in comparison with Example 1 than in comparison with Example 6. This shows that in case of a light transmissive substrate is a resin material a preparation method of a half mirror film by a plasma method in atmospheric pressures is specifically superior.

Example 7

Next, in Example 7, half mirror films having 4 layers structures described in Table 5 were prepared on a glass substrate in a similar manner to example 1 by use of a plasma discharge treatment apparatus of FIG. 9 similar to Example 6.

Mixed Gas to Form a Tantalum Oxide Layer
Inert gas: an argon gas of 98.8 volume %
Reactive gas 1: a hydrogen gas (1 volume % based on the total volume of a mixed gas)
Reactive gas 2: a tantalum tetraisopropoxide vaper (a liquid heated at 160° C. was bubbled with argon gas) of 0.2 volume % based on the total volume of a reactive gas Mixed Gas to Form an Aluminum Oxide Layer
Inert gas: an argon gas of 98.6 volume %
Reactive gas 1: a hydrogen gas (1.2 volume % based on the total volume of a mixed gas)
Reactive gas 2: a tantalum tetraisopropoxide vaper (a liquid heated at 162° C. was bubbled with argon gas) of 0.2 volume % based on the total volume of a reactive gas In Example 7, evaluation similar to that of Example 1 showed results nearly equal to Example 1 and a preferable film thickness value was obtained.

Herein, in the description of the invention, a plasma state refers to a state in which positive (plus) charges and negative (minus) charges are present as a mixture when a reactive gas or a gas containing a reactive gas is made to be in a discharge state by applying electric voltage between electrodes (not being limited to the case in which the same number of positive and negative charges exist).

Effect of the Invention

According to the invention, a preparation method of a half mirror film which has high productivity, as well as superior optical performance, enhanced adhesion with a light transmissive substrate and is hard to produce cracking; and an optical member having the half mirror film can be provided.

What is claimed is:

1. A method of producing a half mirror film on a substrate having a light transmissive property, comprising steps of:
   electrically discharging between electrodes facing each other under an atmospheric pressure or an approximate atmospheric pressure so as to make an reactive gas in a plasma state; and
   exposing a substrate to the reactive gas in the plasma state so as to form a half mirror film on the substrate; wherein the half mirror is a dielectric mirror and the dielectric mirror is a plurality of laminated layers comprising a layer containing silicon oxide as a main component and a layer containing titanium oxide as a main component.

2. A method of producing a half mirror film on a substrate having a light transmissive property, comprising steps of:
   electrically discharging between electrodes facing each other under an atmospheric pressure or an approximate atmospheric pressure so as to make an reactive gas in a plasma state; and
   exposing a substrate to the reactive gas in the plasma state so as to form a half mirror film on the substrate; wherein the half mirror is a dielectric mirror and the dielectric mirror is a plurality of laminated layers comprising a layer containing silicon oxide as a main component and a layer containing titanium oxide, tantalum oxide, zirconium oxide, silicon nitride, indium oxide or aluminum oxide as a main component.

3. A method of producing a half mirror film on a substrate having a light transmissive property, comprising steps of:
   electrically discharging between electrodes facing each other under an atmospheric pressure or an approximate atmospheric pressure so as to make an reactive gas in a plasma state; and
   exposing a substrate to the reactive gas in the plasma state so as to form a half mirror film on the substrate;

wherein the half mirror is a dielectric mirror and wherein the dielectric mirror is a plurality of laminated layers comprising a layer containing silicon oxide as a main component, a layer containing titanium oxide, tantalum oxide, zirconium oxide, silicon nitride, or indium oxide or a layer containing aluminum oxide as a main component.

4. A method of producing a half mirror film on a substrate having a light transmissive property, comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; wherein the electrically discharging is caused by supplying a high frequency voltage higher than 100 kHz and a electric power more than 1 W/cm$^2$.

5. The method of claim 4, wherein the high frequency voltage is a continuous sine wave.

6. A method of producing a half mirror film on a substrate having a light transmissive property, comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; wherein the substrate is a long web-shaped resin film, and further comprising steps of:
conveying the long web-shaped resin film between the electrodes; and
introducing the reactive gas between the electrodes so that a half mirror film is formed on the long web-shaped resin film.

7. A method of producing a half mirror film on a substrate having a light transmissive property comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; wherein the substrate is a resin lens, and further comprising a step of:
blowing the reactive gas on the plasma state onto the lens so that a half mirror film is formed on the resin lens.

8. A method of producing a half mirror film on a substrate having a light transmissive property, comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; further comprising a step of:
introducing a mixed gas containing the reactive gas and an inert gas between the electrodes; wherein the mixed gas contains the inert gas from 99.9 to 90 volume %.

9. The method of claim 8, wherein the mixed gas contains from 0.01 to 5 volume % of at least one component selected from a group consisting of oxygen, ozone, hydrogen peroxide, carbon dioxide, carbon monoxide, hydrogen and nitrogen.

10. A method of producing a half mirror film on a substrate having a light transmissive property, comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; wherein the reactive gas contains at least one component of an organometalic compound and an organic compound.

11. The method of claim 10, wherein the organometalic compound is selected from a group consisting of a metal alkoxide, an alkylated metal and a metal complex.

12. A method of producing a half mirror film on a substrate having a light transmissive property, comprising steps of:
electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate; wherein the half mirror film has a carbon content of 0.2 to 5 weight %.

13. The method of claim 12, wherein the carbon content is 0.3 to 3 weight %.

14. An optical element produced by a method comprising the steps of electrically discharging between electrodes facing each other under an atmospheric pressure or an approximate atmospheric pressure so as to make an reactive gas in a plasma state; and
exposing a substrate to the reactive gas in the plasma state so as to form a half mirror film on the substrate.

15. The optical element of claim 14, wherein the half mirror film is formed by laminating a low refractive index layer which contains silicon oxide as a main component and has a refractive index of 1.35 to 1.51 and a high refractive index layer which contains titanium oxide as a main component and has a refractive index of 2.15 to 2.43, wherein the high refractive index layer having a optical film thickness of 0.047 to 0.05, the low refractive index layer having a optical film thickness of 0.048 to 0.052, the high refractive index layer having a optical film thickness of 0.313 to 0.339, the low refractive index layer having a optical film thickness of 0.340 to 0.370, the high refractive index layer having a optical film thickness of 0.276 to 0.299, the low refractive index layer having a optical film thickness of 0.270 to 0.293, the high refractive index layer having a optical film thickness of 0.320 to 0.347, the low refractive index layer having a optical film thickness of 0.149 to 0.162, the high refractive index layer having a optical film thickness of 0.205 to 0.222, the low refractive index layer having a optical film thickness of 0.110 to 0.120, the high refractive index layer having a optical film thickness of 0.299 to 0.324, the low refractive index layer having a optical film thickness of 0.128 to 0.139, and the high refractive index layer having a optical film thickness of 0.072 to 0.079 are laminated in this order on the substrate having a refractive index of 1.46 to 1.58, and
wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

16. The optical element of claim 14, wherein the half mirror film is formed by laminating a low refractive index layer which contains silicon oxide as a main component and has a refractive index of 1.35 to 1.52. and a high refractive index layer which contains titanium oxide as a main component and has a refractive index of 2.15 to 2.43, wherein the low refractive index layer having a optical film thickness of 0.263 to 0.288, the high refractive index layer having a optical film thickness of 0.062 to 0.068, the low refractive index layer having a optical film thickness of 0.240 to 0.260, the high refractive index layer having a optical film thickness of 0.232 to 0.252, the low refractive index layer having a optical film thickness of 0.205 to 0.222, the high refractive index layer having a optical film thickness of 0.148 to 0.161, the low refractive index layer having a optical film thickness of 0.229 to 0.248, the high refractive index layer having a optical film thickness of 0.251 to 0.272, the low refractive index layer having a optical film thickness of 0.306 to 0.331, the high refractive index layer having a optical film thickness of 0.287 to 0.311, the low refractive index layer having a optical film thickness of 0.284 to 0.308, the high refractive index layer having a optical film thickness of 0.323 to 0.350, the low refractive index layer having a optical film thickness of 0.318 to 0.345, and the high refractive index layer having a optical film thickness of 0.371 to 0.400 are laminated in this order on the substrate having a refractive index of 1.46 to 1.58, and wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

17. The optical element of claim 14, wherein the half mirror film is formed by laminating a low refractive index layer which contains silicon oxide as a main component and has a refractive index of 1,.35 to 1.51 and a high refractive index layer which contains titanium oxide as a main component and has a refractive index of 2.15 to 2.43, wherein the high refractive index layer having a optical film thickness of 0.085 to 0.115, the low refractive index layer having a optical film thickness of 0.065 to 0.100, the high refractive index layer having a optical film thickness of 0.140 to 0.360, the low refractive index layer having a optical film thickness of 0.120 to 0.320, and the high refractive index layer having a optical film thickness of 0.250 to 0.451 are laminated in this order on the substrate having a refractive index of 1.46 to 1.58, and wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

18. The optical element of claim 14, wherein the half mirror film is formed by laminating a low refractive index layer which contains silicon oxide as a main component and, has a refractive index of 1.35 to 1.51 and a high refractive index layer which contains titanium oxide as a main component and has a refractive index of 2.15 to 2.43, wherein the low refractive index layer having a optical film thickness of 0.261 to 0.290, the high refractive index layer having a optical film thickness of 0.258 to 0.281, the low refractive index layer having a optical film thickness of 0.410 to 0.448, the high refractive index layer having a optical film thickness of 0.501 to 0.481, the low refractive index layer having a optical film thickness of 0.601 to 0.625, the high refractive index layer having a optical film thickness of 0.551 to 0.573, the low refractive index layer having a optical film thickness of 0.201 to 0.225, the high refractive index layer having a optical film thickness of 0.261 to 0.285, the low refractive index layer having a optical film thickness of 0.251 to 0.279, and the high refractive index layer having a optical film thickness of 0.281 to 0.305 are laminated in this order on the substrate having a refractive index of 1.46 to 1.58, and wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

19. The optical element of claim 14, wherein the half mirror film is formed by laminating a low refractive index layer which contains silicon oxide as a main component and has a refractive index of 1.35 to 1.51, an intermediate refractive index layer which contains aluminum oxide as a main component and has a refractive index of 1.61 to 1.82 and a high refractive index layer which contains tantalum oxide as a main component and has a refractive index of 1.91 to 2.15, wherein the high refractive index layer having a optical film thickness of 0.195 to 0.231, the low refractive index layer having a optical film thickness of 0.215 to 0.243, the high refractive index layer having a optical film thickness of 0.367 to 0.392, and the middle refractive index layer having a optical film thickness of 0.176 to 0.193 are laminated in this order on the substrate having a refractive index of 1.46 to 1.58, and wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

20. The optical element of claim 14, wherein the half mirror film is formed by laminating a low refractive index layer which contains silicon oxide as a main component and has a refractive index of 1.35 to 1.51 and a high refractive index layer which contains titanium oxide as a main component and has a refractive index of 2.15 to 2.43, wherein the low refractive index layer having a optical film thickness of 0.391 to 0.421, the high refractive index layer having a optical film thickness of 0.261 to 0.231, and the low refractive index layer having a optical film thickness of 0.281 to 0.311 are laminated in this order on the substrate having a refractive index of 1.46 to 1.58, and wherein the refractive index is a refractive index for light having a wavelength of 510 nm and the optical film thickness is a value obtained by a formula of (n×d/510), where n is the refractive index and d is an actual film thickness (unit: nm, a geometrical film thickness).

* * * * *